United States Patent [19]

Hardee et al.

[11] Patent Number: 4,494,221
[45] Date of Patent: Jan. 15, 1985

[54] BIT LINE PRECHARGING AND EQUILIBRATING CIRCUIT

[75] Inventors: Kim C. Hardee; Rahul Sud, both of Colorado Springs, Colo.

[73] Assignee: Inmos Corporation, Colorado Springs, Colo.

[21] Appl. No.: 354,193

[22] Filed: Mar. 3, 1982

[51] Int. Cl.³ .................................................. G11C 7/00
[52] U.S. Cl. ..................................... 365/203; 365/190
[58] Field of Search ............... 365/189, 190, 203, 204, 365/230, 154

[56] References Cited

U.S. PATENT DOCUMENTS

| | | | |
|---|---|---|---|
| 3,953,839 | 4/1976 | Dennison et al. | 365/190 |
| 4,355,377 | 10/1982 | Sud et al. | 365/203 |
| 4,379,344 | 4/1983 | Ozawa et al. | 365/203 |

Primary Examiner—Joseph A. Popek
Attorney, Agent, or Firm—Edward D. Manzo

[57] ABSTRACT

A circuit is described for precharging and equilibrating the bit lines in a semiconductor memory. The circuit includes a pair of precharging transistors, each coupled between its own bit line and a common node, and each adapted to receive a precharging pulse at its gate. A transistor circuit is coupled to the common node to establish thereat a variable operating potential such that when the precharging pulse occurs, one of the precharging transistors conducts to raise its bit line to a precharge potential while simultaneously reducing the operating potential at the common node. The lower voltage at the common node permits the other precharging transistor to conduct so that its bit line is precharged and both bit lines are equilibrated through the conducting transistors.

26 Claims, 3 Drawing Figures

BIT LINE PRECHARGING AND EQUILIBRATING CIRCUIT

BACKGROUND OF THE INVENTION

This invention is directed to a system for equilibrating and precharging bit lines in a semiconductor memory, such as in a RAM (Random Access Memory).

It is a standard practice to equilibrate (short together) and to precharge the bit lines of a semiconductor memory before accessing a memory cell in a column of cells which is coupled to those bit lines. U.S. Pat. Nos. 3,949,385, 4,161,040 and 4,272,832 are illustrative of the various known techniques for effecting such equilibration and precharge. Ser. No. 164,283, entitled "Asynchronously Equilibrated and Pre-Charged Static RAM," filed June 30, 1980, now U.S. Pat. No. 4,355,377 assigned to Inmos Corporation, the assignee of the present invention.

In certain circumstances, conventional techniques for effecting bit line precharge and equilibration can lead to instability in the state of a memory cell and even a loss of data therein. These problems are best explained with reference to FIG. 1 which shows typical circuitry for precharging and equilibrating a pair of bit lines 10 and 12.

The illustrated bit lines are coupled to a column of memory cells which includes cells 14, 16 and a plurality of additional cells (not shown). Column and row select circuitry (also not shown) may be coupled to the bit lines and memory cells for accessing a particular cell in the illustrated column of cells.

Coupled to the top of the bit lines 10 and 12 are an equilibrating transistor 18, precharge transistors 20 and 22, and "keeper" transistors 24 and 26. The gates of transistors 18, 20 and 22 are coupled to a common node 28 which receives a precharge pulse P. This pulse typically goes from zero volts to Vcc for turning on transistors 18, 20 and 22 for a short interval prior to accessing the column. In response to the pulse P, the transistor 18 shorts together bit lines 10 and 12 while transistors 20 and 22 pull both bit lines toward Vcc. At the termination of the pulse P, the bit lines 10 and 12 are intended to be at equal high level potentials. The transistors 24 and 26 merely serve to trickle charge to the bit lines to compensate for charge leakage therefrom.

Under nominal operating conditions, one of the bit lines will be at a relatively low level while the other bit line will be at a relatively higher level. However, transient voltages at the node 28 can cause both bit lines to be pulled to substantially equal low levels. In that condition, the state of the memory cells is unstable and can result in a cell losing its data by flipping to an opposite state due to inherent imbalances in cell construction.

The condition which causes the foregoing problem arises primarily when the pulse P exhibits undesired transients which may be caused by noise and transmission line like reflections. Such transients may result in "glitches" in the pulse P which are exhibited as short duration voltage excursions at the node 28. These transients may also result in the duration of the pulse P being shortened. Whatever the case, the result is that such transients are able to turn on the transistor 18 sufficiently to pull both bit lines to substantially the same low potential, but transistors 20 and 22 are not held on long enough to pull the bit lines to their desired precharge potential. Consequently, both bit lines may be at equal low potentials, thereby causing the memory cells to be in an unstable state.

A general object of the present invention is, therefore, to provide improved precharging and equilibrating circuitry for a semiconductor memory.

It is a more specific object of the invention to provide bit line precharging and equilibrating circuitry which overcomes the drawbacks discussed above and which is no more complex than conventional circuitry.

BRIEF DESCRIPTION OF THE FIGURES

The objects stated above and other objects of the invention are set forth more particularly in the following detailed description and in the accompanying drawings, of which.

SUMMARY OF THE INVENTION

The circuit described herein precharges and equilibrates pairs of bit lines in a semiconductor memory in response to a precharging pulse. For each bit line pair, a first precharging transistor is coupled via its source to one of the bit lines and to a common node via its drain. A second precharging transistor is similarly coupled between the common node and the other bit line, and the gates of both transistors are adapted to receive the precharging pulse.

Transistor means, which may be a single transistor, is coupled between the common node and a source of operating voltage. The transistor means is selected to establish, at the common node, a variable operating potential such that when the precharging pulse occurs, one of the precharging transistors conducts to raise its bit line to a precharge potential while simultaneously reducing the operating potential at the common node. This reduction in the voltage at the common node permits the other precharging transistor to then conduct so that its bit line is pulled up to a precharge potential and both bit lines are equilibrated through the conducting precharging transistors.

DESCRIPTION OF THE PREFERRED EMBODIMENT

Figure 1:
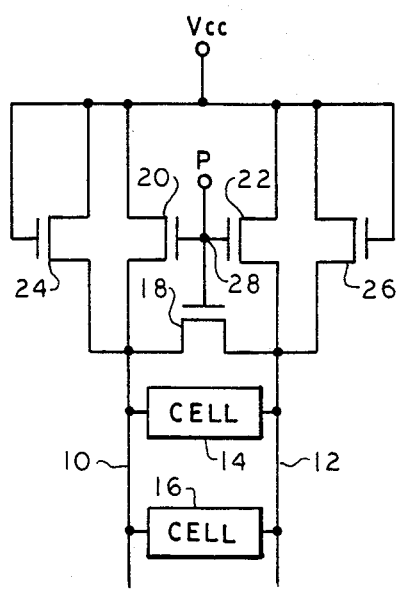
FIG. 1, previously described, illustrates conventional circuitry for precharging and equilibrating bit lines in a semiconductor memory.
Figure 2:
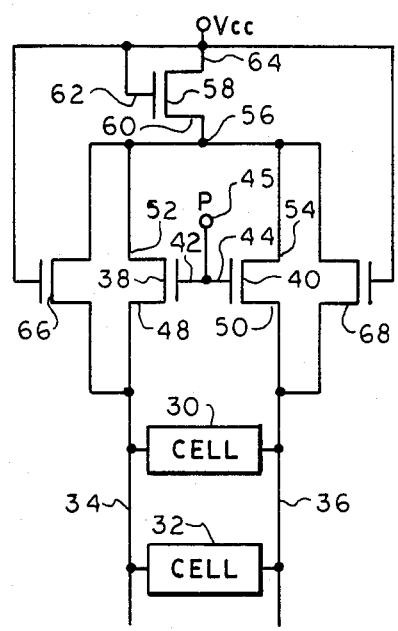
FIG. 2 illustrates circuitry according to the invention for equilibrating and precharging a pair of bit lines in a semiconductor memory.
Figure 3:
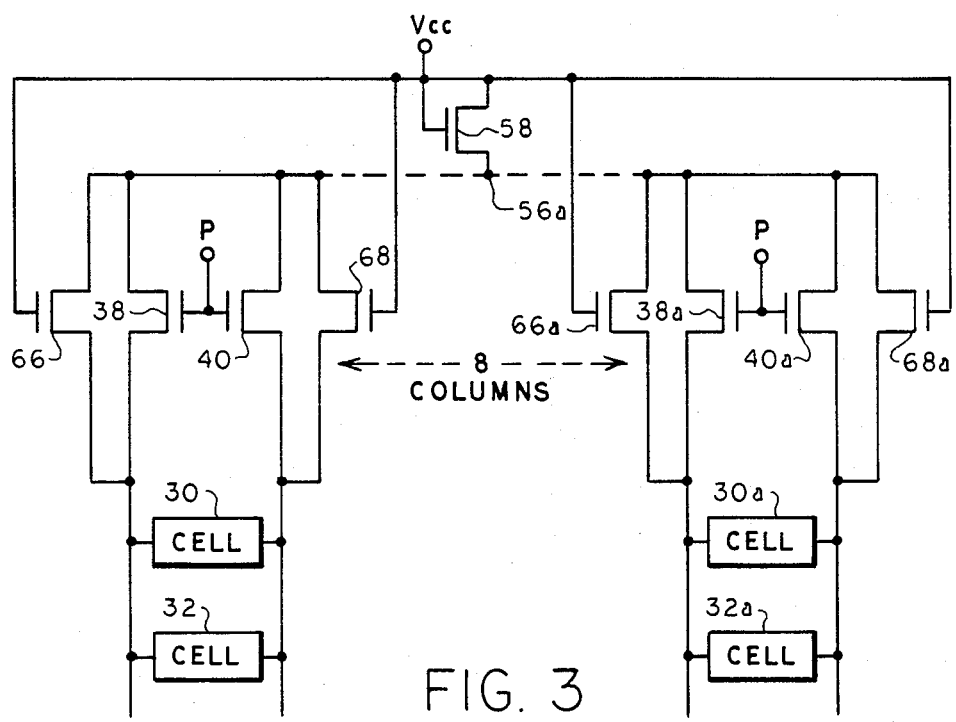
FIG. 3 illustrates a preferred embodiment of the invention wherein the bit lines associated with eight columns of memory cells are coupled to a common node for purposes of precharging and equilibration.

The precharging and equilibrating circuits shown in FIGS. 2 and 3 are designed for use with a high speed, fully asynchronous, MOS memory. It will be appreciated, however, that the invention may be utilized in any suitable semiconductor memory.

Referring first to FIG. 2, memory cells 30 and 32 are shown as being connected between a pair of bit lines 34 and 36. Normally, many more such cells will be included in a single column of cells, but the additional cells have not been shown in order to simplify the drawings. The usual circuitry for accessing a particular cell has also been omitted for purposes of simplicity.

The circuitry for precharging and equilibrating the bit lines 34 and 36 includes a first precharging transistor 38 and a second precharging transistor 40. Each of these transistors includes a gate, a source, and a drain. Because these and other such transistors are symmetrical devices, their drains may operate as sources and vice versa, depending on the potentials applied to the electrodes of the transistors. Hence, reference in this description and in the claims to the "drain" of a transistor is meant to refer to a "source" and vice versa under conditions in which the drain functions as a source or a source functions as a drain.

In the illustrated embodiment, the gates 42 and 44 of transistors 38 and 40 are adapted to receive a precharging pulse P at an input terminal 45. This pulse P is preferably generated asynchronously as described in U.S. Pat. No. 4,355,377, filed June 30, 1980, and may extend between zero volts and Vcc.

The source 48 of the transistor 38 is coupled to the bit line 34, whereas the source 50 of transistor 40 is coupled to the bit line 36. The drains 52 and 54 of these transistors are coupled to a common node 56.

Those skilled in the art will appreciate that the bit lines 34 and 36 will normally be at opposite logic levels. For example, the bit line 34 may be at zero volts (logic zero) while the bit line 36 is at Vcc-Vt (logic 1), where Vt is the threshold voltage of the transistors. Assuming that the common node 56 is also at Vcc-Vt, the occurrence of the precharging pulse drives the gates of transistors 48 and 50 to Vcc. In this condition, the transistor 40 is non-conductive because the potential from its gate to either its source 50 or its drain 54 is not greater than Vt. However, the transistor 38 conducts in this condition because its gate to source potential exceeds Vt by virtue of the bit line 34 being at zero volts. Hence, the potential on the bit line 34 is pulled up to a precharge potential.

To permit the transistor 40 to become conductive, means in the form of a relatively low impedance transistor 58 is included for establishing, at the common node 56, a variable operating potential such that when the precharge pulse P occurs and the transistor 38 conducts, the potential at node 56 decreases sufficiently to permit conduction of the transistor 40. For this purpose, the source 60 of transistor 58 is coupled to the common node 56, and its gate 62 and drain 64 are coupled to a source of operating voltage (Vcc). The size of the transistor 58 is selected to permit the potential at node 56 to dip sufficiently when the transistor 38 conducts to permit the bit lines 34 and 36 to be equilibrated. At the same time, the size of transistor 58 is large enough to limit the voltage dip at node 56 to a value which prevents the bit lines from being equilibrated to an undesirably low voltage. For example, the voltage at node 56 should ordinarily not dip below about three volts when Vcc is five volts. Both conditions are met in the embodiment of FIG. 2 by selecting the transistor 58 to be substantially the same size as the transistors 38 and 40.

With the arrangement described above, the potential on the common node 56 is near Vcc-Vt when the memory is powered up. When the transistor 38 conducts in response to the pulse P, the transistor 38 drains charge from the node 56 to cause the potential thereat to decrease. Consequently, the potential from the gate 44 to the drain 54 of transistor 40 now exceeds Vt, wherefore transistor 40 becomes conductive for pulling the potential on the bit line 36 up to a precharge potential. In addition, the bit lines 34 and 36 are now equilibrated via conducting transistors 38 and 40.

It is significant that the low bit line (line 34 in this example) is precharged by the conduction of transistor 38 prior to equilibration. Hence, should a "glitch" in the pulse P turn on the transistor 38 briefly, the potential on bit line 34 will be raised before the transistor 40 conducts. Consequently, the high potential on bit line 36 is not decreased to the previously low level on bit line 34. Thus, the logic states of the memory cells are preserved since the bit lines are never at a substantially equal low level.

In the case where bit line 36 is at a logic zero level and bit line 34 is at a logic 1 level, the transistor 40 conducts first in response to the pulse P. The potential at node 56 then dips to permit conduction of the transistor 38.

If it is desired to trickle charge to the bit lines 34 and 36, "keeper" transistors 66 and 68 may be included and coupled to the bit lines as shown.

In practice, it may not be practical to use one common node for each column of memory cells, depending on the bit line pitch. It may also be impractical to use one such node for each half of a memory array if word line delays result in an insufficient decrease in the potential at node 56 during precharge. In addition, it has been found that coupling two columns of memory cells to a single precharging and equilibrating circuit can result in pattern sensitivity problems, i.e., writing data into one column can cause a disturbance of data in the adjacent column. These problems are overcome, however, by simultaneously precharging and equilibrating eight columns of memory cells in the manner depicted in FIG. 3.

As shown, the column which includes memory cells 30 and 32 is coupled to transistors 38, 40, 58, 66 and 68 in the same manner which is illustrated in FIG. 2. A total of eight columns of memory cells are coupled to the transistor 58 in the same way. For example, the eight columns include memory cells 30a and 32a coupled to precharging transistors 38a and 40a and to keeper transistors 66a and 68a. The drains of the precharging and keeper transistors are coupled to the source of transistor 58 at node 56a. Thus, while each column of cells has its own precharging and keeper transistors, a single transistor 58 serves eight columns.

To ensure that the potential on node 56a decreases sufficiently when the pulse P causes conduction of precharging transistors, the size of the transistor 58 should be increased in comparison to the size used in FIG. 2. In general, the size of transistor 58 should be N times larger than its size when used with one column, where N is equal to the number of columns of memory cells served by the transistor 58. Thus, in the embodiment of FIG. 3, the width of transistor 58 is selected to be eight times larger than the width of transistors 38 or 40.

The use of a single common node with eight columns of memory cells has been found to result in no substantial pattern sensitivity problems. Also, this arrangement is suitable for commonly used bit line pitches.

From the foregoing description, it will be apparent that the present precharging and equilibrating circuit is no more complex than conventional circuits which provide the same functions. Moreover, the present circuit ensures the stability of data in the memory cells, even in the presence of transients which result in an undesirably short precharging pulse.

Although the invention has been described in terms of preferred structure, it will be obvious to those skilled in the art that many alterations and modifications may be made without departing from the invention. Accordingly, it is intended that all such alterations and modifications be considered as within the spirit and scope of the invention as defined by the appended claims.

What is claimed is:

1. A circuit for precharging and equilibrating bit lines in a semiconductor memory in response to a precharging pulse, comprising:
a first precharging transistor having a gate coupled to receive the precharging pulse, a source coupled to a first bit line, and a drain coupled to a common node;
a second precharging transistor having a gate coupled to receive the precharging pulse, a source coupled to a second bit line, and a drain coupled to said common node; and
transistor means coupled to said common node and having its size selected for establishing, at said common node, a variable operating potential such that when the precharging pulse occurs, said first transistor conducts to raise the potential of the first bit line and decrease the potential at the common node sufficiently to permit conduction of the second transistor, whereby a low potential on either bit line is pulled high and the bit line potentials are rendered substantially equal.

2. A circuit as set forth in claim 1 wherein said transistor means includes a third transistor having a gate coupled to a source of operating voltage, having a drain coupled to said source of operating voltage, and having a source coupled to said common node.

3. A circuit as set forth in claim 2 wherein the third transistor is a relatively low impedance device in comparison to said first and second transistors.

4. A circuit as set forth in claim 3 wherein said third transistor has substantially the same size as said first and second precharging transistors.

5. A circuit as set forth in claim 1 including additional pairs of bit lines coupled to said common node.

6. A circuit as set forth in claim 5 wherein bit lines associated with eight columns of memory cells are coupled to said common node via precharging transistors corresponding to said first and second transistors.

7. A circuit as set forth in claim 6 wherein said transistor means includes a third transistor having a gate coupled to a source of operating voltage, having a drain coupled to said source of operating voltage, and having a source coupled to said common node.

8. A circuit as set forth in claim 7 wherein the third transistor is selected to have a width which is a selected multiple greater than the widths of said precharging transistors.

9. A circuit as set forth in claim 8 wherein the width of the third transistor is selected to be about eight times greater than the width of any one precharging transistor.

10. A circuit as set forth in claim 7 wherein the size of the third transistor is selected to permit the potential at the common node to dip upon conduction of said first transistor while limiting said dip to a value which prevents the first and second transistors from equilibrating the bit lines to an undesirably low voltage.

11. A circuit as set forth in claim 1 wherein said transistor means includes a transistor which is sized and connected to permit the potential at the common node to dip upon conduction of said first transistor while limiting said dip to a value which prevents the first and second transistors from equilibrating the bit lines to an undesirably low voltage.

12. In a precharging and equilibration circuit having a selected number of pairs of precharging transistors coupled to a corresponding number of bit lines pairs in a semiconductor memory, the improvement comprising:
means for coupling the precharging transistors to a common node; and
transistor means for establishing, at the common node, a variable operating potential such that, upon conduction of one of a pair of precharging transistors, the potential at the common node decreases to permit conduction of the other precharging transistor in the same pair so that a low potential on either bit line of the conducting precharging transistors is pulled high and the potentials on the latter bit lines are pulled to substantially the same level.

13. A circuit for precharging and equilibrating bit lines in a semiconductor memory in response to a precharging pulse, comprising:
eight columns of memory cells, each column having a first and second bit line;
sixteen precharging transistors, each having a gate coupled to receive the precharging pulse, each having a drain coupled to a common node, and each having a source, the sources of said precharging transistors each being coupled to a different one of the bit lines; and
a further transistor having a gate coupled to a source of operating voltage, having a drain coupled to said source of operating voltage, and having a source coupled to said common node, said further transistor being selected to establish, at the common node, a variable operating potential such that when the precharge pulse occurs, precharging transistors which are coupled to a low bit conduct, the operating potential on the common node decreases, and the remaining precharging transistors then conduct in response to the decreased potential at the common node.

14. A method for precharging and equilibrating pairs of bit lines in a semiconductor memory the memory being operative so that when one of the bit lines is at a voltage representing a logic zero, the other bit line of the pair is normally at a voltage level representing a logic one, comprising the steps of:
applying a precharge pulse to first and second precharging transistors;
controlling the voltages of said first and second transistors so that in response to the application of said precharging pulse to said transistors, only one of said transistors turns on;
applying a precharging voltage to one of the bit lines when said one of said precharging transistors is turned on;
in response to application of said precharge pulse and application of precharging voltage to said one bit line, varying a voltage coupled to the other one of said precharging transistors so that it turns on after the other precharging transistor is turned on;
while said other precharging transistor is on, applying a precharging voltage to the other bit line; said precharging voltage applied to each of the bit lines being the same, whereby said bit lines are both precharged and equilibrated.

15. The method according to claim 14 wherein said first precharging transistor has its source-drain path coupling one of said bit lines to a common node, and wherein said second precharging transistor has its source-drain path coupling the other bit line to said common node, and wherein said method includes applying a voltage to said common node which varies during the application of said precharging pulse.

16. The method according to claim 15 wherein the voltage at said common node is controlled so that when the precharging pulse begins, the voltage at the common node does not deviate from the voltage corresponding to a logic one on a bit lines by more than a voltage transition (Vt), whereby said precharging transistor corresponding to the bit line representing a logic one does not turn on, the method further comprising, thereafter controlling the voltage at said common node to deviate from the voltage of the bit line corresponding to a logic one by more than a voltage transition, whereby the corresponding precharging transistor turns on and applies precharging voltage to its respective bit line.

17. The method according to claim 16 wherein said first and second precharging transistors are controlled to be on together at some time thereby to equilibrate the pair of bit lines via the source-drain paths of first and second precharging transistors and said common node.

18. A method of precharging a pair of bit lines in a semiconductor memory in response to a precharging pulse, the memory having first and second precharging transistors each corresponding to respective first and second bit lines in a pair and each having a gate coupled to receive the precharging pulse, the method comprising the steps of:
turning on only the first precharging transistor in response to the precharging pulse to apply precharging voltage to only one bit line of the pair; and subsequently
turning on the second precharging transistor to apply precharging voltage to the other bit line of the pair.

19. The method according to claim 18 further including controlling the voltages at the drains of the first and second precharging transistors so that despite the application of the precharging pulse to the gates of the precharging transistors, one of the precharging transistors initially is prevented from turning on and from applying precharging voltage to its corresponding bit line, while the other of the precharging transistors is permitted to be turned on in response to the precharging pulse to its gate.

20. The method according to claim 19 further including adjusting the voltages applied to the precharging transistors so that after one of the bit lines has been coupled to a source of precharging voltage, the voltages at the drains of the precharging transistors are adjusted to discontinue the prevention of conduction of both precharging transistors at concurrent times.

21. A circuit for precharging a pair of bit lines in a semiconductor memory in response to a precharging pulse comprising:
a first precharging transistor corresponding to one of the bit lines;
a second precharging transistor corresponding to the other bit line;
means for applying the precharging pulse to the gates of the first and second precharging transistors;
means coupled to said first and second precharging transistors for initially preventing one of said precharging transistors from turning on despite the application of the precharging pulse to the gates thereof.

22. The apparatus according to claim 21 wherein said means for preventing responds to the precharging of a bit line to discontinue the prevention of both precharging transistors from being on at the same time, whereby when the precharging pulse is applied, one of the precharging transistors turns on to apply precharging voltage to its corresponding bit line while the means for preventing prevents the other precharging transistor from turning on initially, and thereafter, the second precharging transistor is permitted to turn on thereby to apply precharging voltage to the other bit line.

23. The circuit according to claim 22 wherein said means for preventing, said first precharging transistor, and said second precharging transistor are coupled all to a common node, and said means for preventing is selected in size so that at some time after the initiation of the precharging pulse, both the first and second precharging transistors will be on and the voltages on the bit lines will equilibrate via the common node.

24. The circuit according to claim 23 wherein the means for preventing includes a transistor which corresponds to N columns of bit lines, and wherein the size of said means for preventing transistor is greater by a multiple of N than the corresponding size of the precharging transistors.

25. The circuit according to claim 22 wherein said means for preventing includes a low impedance transistor coupled between the precharging transistors and a source of operating voltage.

26. The circuit according to claim 25 wherein said low impedance transistor, said first precharging transistor and said second precharging transistor all have a dimension which is substantially the same size.

* * * * *